US012648449B2

(12) United States Patent
Martin et al.

(10) Patent No.: US 12,648,449 B2
(45) Date of Patent: Jun. 2, 2026

(54) INTEGRATED CIRCUIT (IC) PACKAGE INCLUDING AN INDUCTIVE DEVICE FORMED IN A CONDUCTIVE ROUTING REGION

(71) Applicant: Microchip Technology Incorporated, Chandler, AZ (US)

(72) Inventors: Matthew Martin, Gilbert, AZ (US); Bomy Chen, Newark, CA (US); Julius Kovats, Manitou Springs, CO (US)

(73) Assignee: Microchip Technology Incorporated, Chandler, AZ (US)

( * ) Notice: Subject to any disclaimer, the term of this patent is extended or adjusted under 35 U.S.C. 154(b) by 390 days.

(21) Appl. No.: 18/351,591

(22) Filed: Jul. 13, 2023

(65) Prior Publication Data

US 2024/0282723 A1      Aug. 22, 2024

Related U.S. Application Data

(60) Provisional application No. 63/447,104, filed on Feb. 21, 2023.

(51) Int. Cl.
| | |
|---|---|
| *H10W 44/00* | (2026.01) |
| *H10P 95/00* | (2026.01) |
| *H10W 70/65* | (2026.01) |
| *H10W 70/685* | (2026.01) |
| *H10W 74/10* | (2026.01) |
| *H10W 90/00* | (2026.01) |

(52) U.S. Cl.
CPC .......... *H10W 44/501* (2026.01); *H10P 95/00* (2026.01); *H10W 70/65* (2026.01); *H10W 70/685* (2026.01); *H10W 74/111* (2026.01); *H10W 90/00* (2026.01); *H10W 90/794* (2026.01)

(58) Field of Classification Search
CPC ........... H01L 23/645; H01L 2924/1206; H01L 23/3107; H01L 25/16; H01L 23/49822; H01L 23/49838; H01L 24/24; H01L 24/13; H01L 24/16; H01L 2224/24226; H10D 1/20; H10W 44/501; H10W 70/60; H10W 90/794; H10W 70/65; H10W 70/685
USPC ....................................................... 257/531
See application file for complete search history.

(56) References Cited

U.S. PATENT DOCUMENTS

| | | | |
|---|---|---|---|
| 2012/0146181 A1 | 6/2012 | Lin et al. ....................... | 257/531 |
| 2014/0159850 A1* | 6/2014 | Roy .................... | H01F 17/0013 |
| | | | 336/200 |
| 2014/0266530 A1* | 9/2014 | Andres ................. | H01F 27/306 |
| | | | 336/170 |

(Continued)

OTHER PUBLICATIONS

International Search Report and Written Opinion, Application No. PCT/US2023/030663, 13 pages.

*Primary Examiner* — Didarul A Mazumder
(74) *Attorney, Agent, or Firm* — SLAYDEN GRUBERT BEARD PLLC

(57) ABSTRACT

An integrated circuit (IC) package includes a bare die mounted on a substrate, and a conductive routing region including conductive routing structure and an inductor. The conductive routing structure is conductively connected to the bare die, and includes conductive elements formed in multiple conductive routing layers in the conductive routing region. The inductive device includes a winding formed in at least one conductive routing layer of the multiple conductive routing layers.

13 Claims, 14 Drawing Sheets

(56)  References Cited

U.S. PATENT DOCUMENTS

| 2015/0206837 | A1 * | 7/2015 | Gu | H01L 21/76838 |
| | | | | 438/381 |
| 2017/0271260 | A1 | 9/2017 | Wojnowski et al. | |
| 2019/0027303 | A1 * | 1/2019 | Zhang | H01F 41/0206 |
| 2019/0295972 | A1 * | 9/2019 | Tsai | H01Q 23/00 |
| 2020/0176384 | A1 * | 6/2020 | Wu | H01L 25/0655 |
| 2022/0344260 | A1 * | 10/2022 | Tange | H10W 20/497 |
| 2024/0222320 | A1 * | 7/2024 | Nad | H01L 25/18 |

* cited by examiner

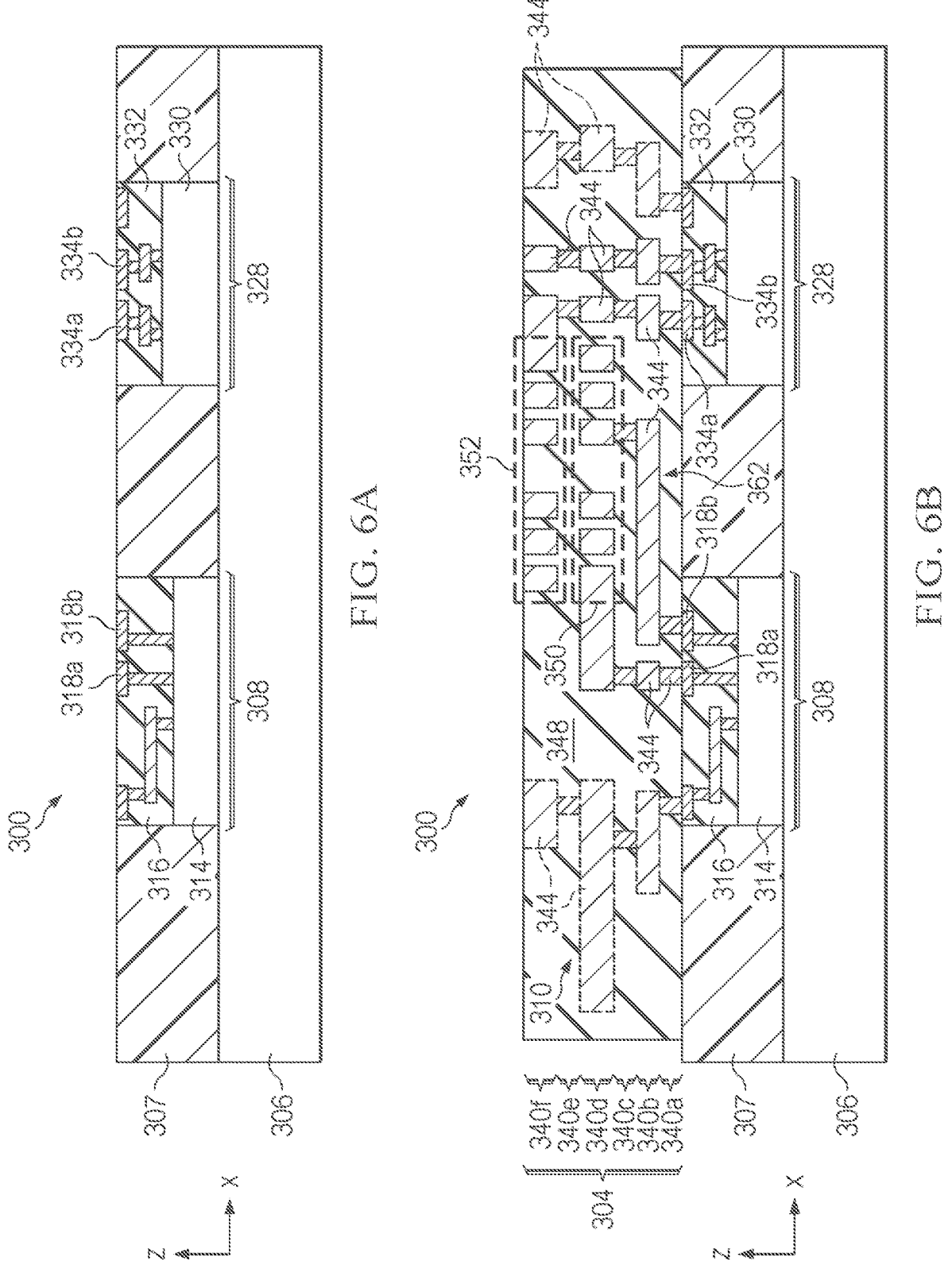

INTEGRATED CIRCUIT (IC) PACKAGE INCLUDING AN INDUCTIVE DEVICE FORMED IN A CONDUCTIVE ROUTING REGION

RELATED PATENT APPLICATION

This application claims priority to commonly owned U.S. Provisional Patent Application No. 63/447,104 filed Feb. 21, 2023, the entire contents of which are hereby incorporated by reference for all purposes.

TECHNICAL FIELD

The present disclosure relates to integrated circuit (IC) packages, and more particularly to an IC package including an inductive device formed in a conductive routing region over one or more bare dies, and methods of forming such IC package.

BACKGROUND

Certain types of IC packages, for example certain system-in-packages (SiP) and panel level packages (PLP) include multiple chips enclosed or otherwise provided in a single package. As used herein, a chip is also referred to as a "bare die," wherein a bare die (or chip) includes IC circuitry (e.g., transistor, resistor, capacitor, diode, inductor, logic gate, operational amplifier, and/or other IC circuit element(s), a dielectric (e.g., passivation region) at least partially encapsulating the IC circuitry, and at least one contact (e.g., at least one top metal element, bond pad, or other contact) exposed through the dielectric to allow electrical connection to the IC circuitry. Some example types of bare dies include microcontrollers (MCU), central processing units (CPUs), application-specific integrated circuits (ASICs), field programmable gate arrays (FPGAs), drivers, memory chips, and system-on-a-chip (SoC) devices.

A typical SiP or PLP includes multiple bare dies mounted on a substrate, and a redistribution layer (RDL) region including conductive metal structures connecting selected bare dies to each other and/or to external devices. Some SiPs and PLPs include inductive devices providing inductance-related functionality for one or more bare dies mounted in the respective SiP or PLP. As used herein, an "inductive device" refers to an electrical device including at least one winding (or "coil") that generates an electromagnetic inductance in response to an applied current. Inductive devices include, for example, inductors, transformers, antennas, diplexers, and other devices including winding(s) that generate an electromagnetic inductance.

In conventional SiPs and PLPs, inductive devices are commonly integrated in a respective bare die mounted with other bare die(s) in the respective SiP and PLP. An inductive device integrated in a respective bare die may be referred to as a "chip-level" or "on-chip" inductive device. On-chip inductive devices may be formed as discrete chip-level devices (i.e., as discrete bare dies), or may be integrated with other circuitry in a respective bare die.

Some SiPs and PLPs include an on-chip inductive device mounted on the SiP or PLP package substrate along with other bare dies, with the inductive device electrically connected between two or more bare dies by a conductive RDL structure formed in the RDL region, the inductive device e.g., for storing energy (in the case of an inductor) or transforming energy (in the case of a transformer). Such on-chip inductive devices may be expensive and may require a relatively large area (footprint).

As an alternative, inductive devices utilized by an SiP or PLP may be provided on a printed circuit board (PCB) separate from the SiP or PLP, which typically requires a relatively large area (footprint) on the PCB.

There is a need for improved integration of inductive devices in IC packages, e.g., SiPs and PLPs, for example with low cost and/or compact size as compared with conventional solutions.

SUMMARY

Examples of the present disclosure provide IC packages, for example panel-level packages (PLPs), system-in-packages (SiPs) or other chip-first packages including one or more bare dies (also referred to as chips) mounted on a substrate, and a conductive routing region (e.g., an RDL region) formed over the bare die(s)), wherein the conductive routing region includes both (a) a conductive routing structure (e.g., to connect respective bare dies to each other and/or to external contacts) and (b) an inductive device including at least one winding, which inductive device may also be referred to herein as "in-package inductive device." Some example types of in-package inductive devices according to the present disclosure include inductors, transformers, antennas, and diplexers.

Some examples provide "mixed-voltage" packages (e.g., PLPs or SiPs) including multiple bare dies that operate at different voltages (e.g., including at least one high-voltage die and at least one low-voltage die), wherein such bare dies may be galvanically isolated by an in-package inductive device formed in the conductive routing region (e.g., RDL region) formed over the bare dies.

One aspect provides an integrated circuit (IC) package including a bare die mounted on a substrate, and a conductive routing region including conductive routing structure and an inductor. The conductive routing structure is conductively connected to the bare die, and includes conductive elements formed in multiple conductive routing layers in the conductive routing region. The inductive device includes at least one winding formed in at least one conductive routing layer of the multiple conductive routing layers.

In some examples, the IC package comprises a chip-first package.

In some examples, the conductive routing region comprises a redistribution layer (RDL) region, wherein respective conductive routing layers of the multiple conductive routing layers comprise respective RDL layers.

In some examples, the conductive routing structure includes at least one conductive element connecting the winding of the inductive device to the bare die.

In some examples, the conductive routing structure includes at least one conductive element separate from the inductive device and formed in a common conductive routing layer as a respective winding of the at least one winding.

In some examples, the inductive device including at least one winding comprises an inductor including a single winding.

In some examples, the inductive device including at least one winding comprises a transformer including a first winding and a second winding magnetically coupled to the first winding.

In some examples, the first winding is formed in a first conductive routing layer of the multiple conductive routing layers, and the second winding is formed in a second conductive routing layer of the multiple conductive routing layers.

In some examples, the IC package includes a further bare die mounted to the substrate, the first winding is conductively coupled to the bare die, and the second winding is conductively coupled to the further bare die.

In some examples, the IC package includes a further bare die mounted to the substrate, and the inductive device is inductively coupled between the bare die and the further bare die.

In some examples, the conductive routing structure includes an external contact element contactable by an external device, and the inductive device is inductively coupled between the bare die and the external contact element.

In some examples, a respective winding of the at least one winding has a spiral shape.

In some examples, the IC package includes a core comprising a magnetic paste or other material having a permeability greater than 1.0, wherein the at least one winding extends around the core.

One aspect provides a method of forming an IC package. A bare die is mounted on a substrate, wherein the bare die includes IC elements, a dielectric region at least partially encapsulating the IC elements, and an IC contact exposed through the dielectric region. A conductive routing region is formed over the bare die, wherein the conductive routing region includes (a) a conductive routing structure conductively connected to the IC contact of the bare die, and (b) an inductive device. The conductive routing region includes multiple conductive routing layers, the conductive routing structure includes conductive elements formed in respective conductive routing layers of the multiple conductive routing layers, and the inductive device includes a winding formed in at least one conductive routing layer of the multiple conductive routing layers.

In some examples, forming the conductive routing region including multiple conductive routing layers comprises forming a redistribution layer (RDL) region including multiple RDL layers.

In some examples, the method includes forming a respective conductive element of the conductive routing structure, separate from the winding, in a common conductive routing layer as the winding.

In some examples, the conductive routing structure connects the winding of the inductive device to the bare die.

In some examples, the method includes forming an inductor core by forming an opening in the conductive routing region, and depositing a core material in the opening, wherein the winding extends around the inductor core.

In some examples, the method includes forming the opening by a laser drilling process.

One aspect provides an IC package including a first bare die and a second bare die mounted on a substrate, and a conductive routing region including a conductive routing layer stack formed over the first bare die and the second bare die, a conductive routing structure comprising at least one first conductive element formed in the conductive routing layer stack, and an inductive device forming an inductive connection between the first bare die and the second bare die, wherein the inductive device includes a winding comprising at least one second conductive element formed in the conductive routing layer stack.

In some examples, the conductive routing layer stack comprises at least one redistribution layer (RDL).

BRIEF DESCRIPTION OF THE DRAWINGS

Example aspects of the present disclosure are described below in conjunction with the figures, in which:

FIGS. 6A-6E are a series of cross-sectional side views showing an example method of forming the example IC package shown in FIGS. 3A-3C.

It should be understood the reference number for any illustrated element that appears in multiple different figures has the same meaning across the multiple figures, and the mention or discussion herein of any illustrated element in the context of any particular figure also applies to each other figure, if any, in which that same illustrated element is shown.

DETAILED DESCRIPTION

Examples of the present disclosure provide IC packages (e.g., SiPs or PLPs), for example panel-level packages (PLPs) or other chip-first polymer packages, that include at least one in-package inductive device (e.g., at least one inductor, transformer, or antenna) formed in a conductive routing region (e.g., RDL region) formed over one or more bare dies mounted in the IC package.

In some examples, an in-package inductive device formed in the conductive routing region of an IC package forming an inductive connection between discrete elements of a respective bare die. For example, an in-package inductive device may comprise an inductor connected between two contacts of a respective bare die.

In other examples, an in-package inductive device formed in the conductive routing region of an IC package forming an inductive connection between multiple bare dies mounted in the IC package. For example, some examples provide a "mixed-voltage" IC package including multiple bare dies that operate at different voltages (e.g., including at least one high-voltage bare die and at least one low-voltage bare die), wherein such bare dies may be galvanically isolated from each other by an in-package inductive device, e.g., a transformer formed in the RDL region over the bare dies.

In other examples, an in-package inductive device forms an inductive connection between a respective bare die mounted in the IC package and an external contact element of the IC package, e.g., to provide galvanic isolation between the respective bare die and an external device (external to the IC package) connected to the external contact element.

Figures 1A, 1B:
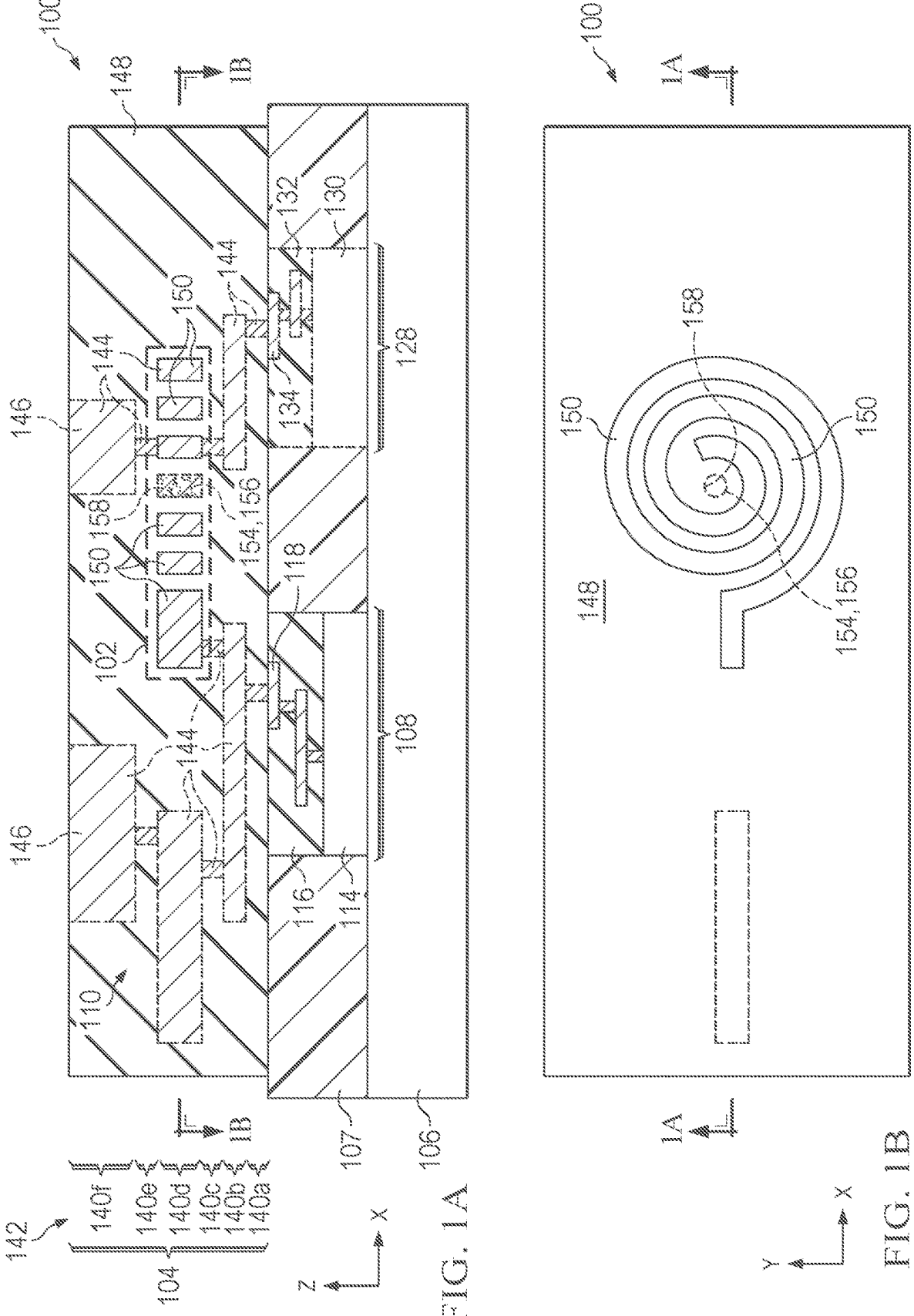
FIGS. 1A and 1B show respective cross-sectional views of an example IC package including an in-package inductive device, e.g., an inductor, formed in a conductive routing region over one or more bare dies mounted in the IC package.
Figure 2:
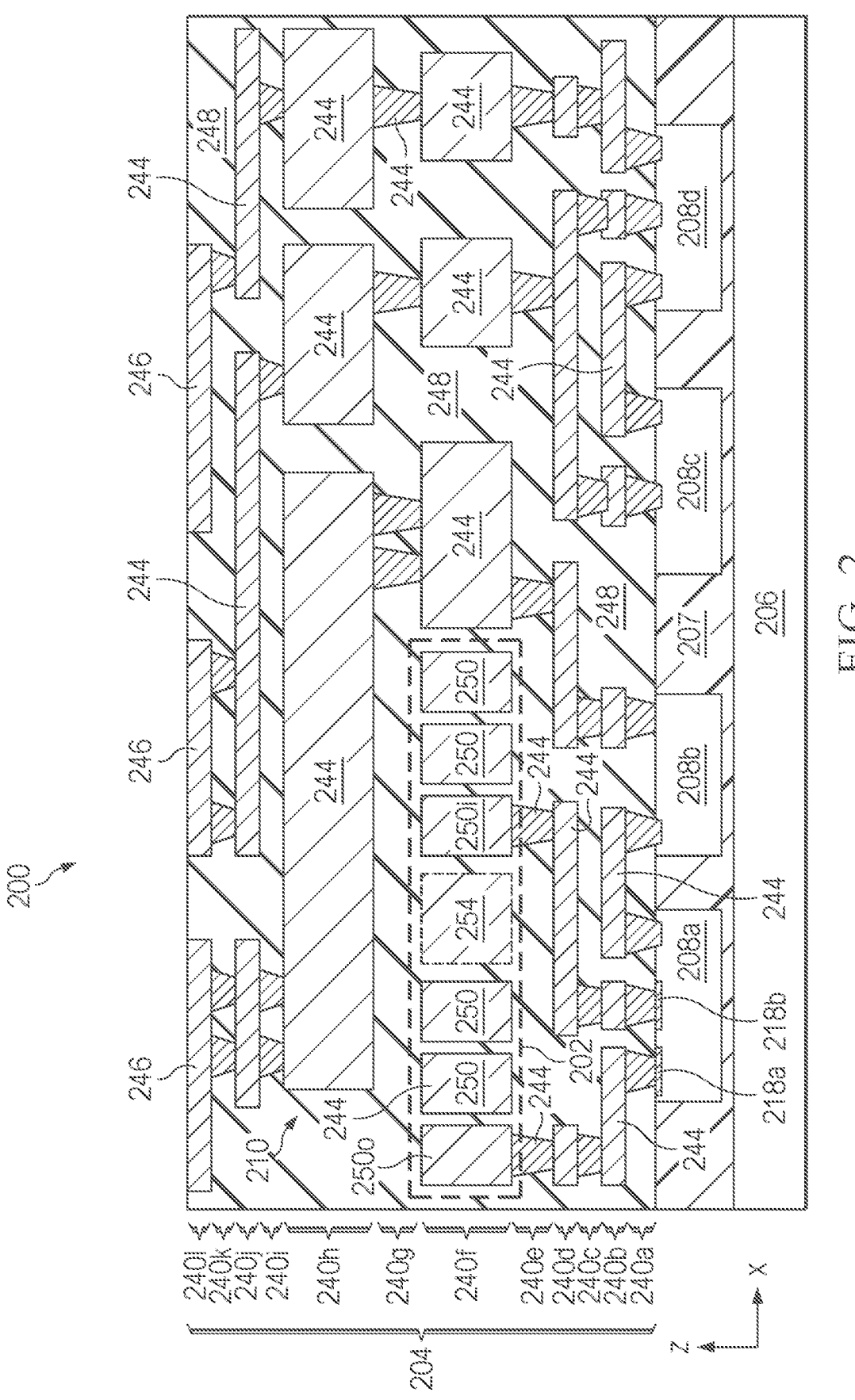
FIG. 2 is a cross-sectional side view of an example IC package including an example in-package inductive device, e.g., an inductor, connected to a respective bare die mounted in the IC package.

Some examples provide an IC package formed with an in-package inductive device including one or more windings. In some examples, an IC package includes an in-package inductive device including a single winding, e.g., an in-package inductor including a single winding. For example, FIGS. 1A-1B and FIG. 2 show example IC packages including an inductor including a single winding. In other examples, an IC package includes an in-package inductive device including multiple winding, e.g., an in-package transformer including a pair of windings. For example, FIGS. 3A-3B, FIG. 4, and FIG. 5 show example IC packages including an in-package transformer including a pair of magnetically coupled windings.

In some examples, an in-package inductive device may include a core comprising a high-permeability material (e.g., having a permeability greater than 1.0) formed within the winding(s) of the in-package inductive device (e.g., wherein the winding(s) extend around the core), for example to provide enhanced inductive coupling.

FIGS. 1A and 1B show an example integrated circuit (IC) package 100 including an in-package inductive device 102 formed in a conductive routing region 104, according to one example. FIG. 1A is a cross-sectional side view of IC package 100 through line 1A-1A shown in FIG. 1B, and FIG. 1B is a top-down cross-sectional view through line 1B-1B shown in FIG. 1A.

The example IC package 100 may include a substrate 106, a bare die 108 mounted on the substrate 106, the conductive routing region 104 (e.g., an RDL region) formed over the bare die 108, and a conductive routing structure 110, wherein the conductive routing structure 110 and the in-package inductive device 102 are formed in the conductive routing region 104. In some examples, the IC package 100 may comprise a panel-level package (PLP) or a system-in-package (SiP) formed by a chip-first method wherein the bare die 108 is mounted to the substrate 106 prior to forming the conductive routing region 104 over the bare die 108.

The bare die 108 may comprise any type of bare die or chip, for example a microcontroller (MCU), central processing unit (CPU), application-specific integrated circuit (ASIC), field programmable gate array (FPGA), digital signal processor (DSP), driver, memory, analog to digital converter (ADC), digital to analog converter (DAC), silicon carbide (SiC) chip, or system-on-a-chip (SoC), without limitation.

The bare die 108 may include IC circuitry 114, a dielectric region 116 at least partially encapsulating the IC circuitry 114, and an IC contact 118 exposed through the dielectric region 116. The IC circuitry 114 may include at least one transistor, resistor, capacitor, diode, inductor (i.e., "on-chip" or "chip-level" inductor), logic gate, operational amplifier, and/or other IC circuit element(s). The dielectric region 116 may comprise a polyimide or other passivation region or material, or any other insulative material at least partially covering the IC circuitry 114, for example to provide electrical insulation, physical protection and/or structural support. The IC contact 118 may comprise a top metal element, bond pad, or other conductive element allowing electrical connection between the IC circuitry 114 and external electronics (i.e., outside the bare die 108).

As discussed below, in some examples the IC package 100 may include multiple bare dies mounted on the substrate 106. For example, FIG. 1 shows the bare die 108 and an optional further bare die 128, which may include respective IC circuitry 130, a dielectric region 132 at least partially encapsulating the IC circuitry 130, and an IC contact 134 exposed through the dielectric region 132. In some examples, the IC package 100 may be formed as a panel-level package (PLP) or a system-in-package (SiP) including any number of bare dies (e.g., at least bare dies 108 and 128), wherein PLP or SiP is formed by a chip-first method in which the bare dies (e.g., at least bare dies 108 and 128) are mounted to the substrate 106 prior to forming the conductive routing region 104 (e.g., RDL region) including the in-package inductive device 102 over the bare dies. The bare die 108 and further bare die 128 may also be referred to as a first bare die 108 and a second bare die 128.

The substrate 106 may comprise a polymer, e.g., an epoxy, polyimide, or polybenzoxazole (PBO), or other suitable substrate for mounting bare die(s). The bare die 108 and (optional) further bare die 128 mounted on the substrate 106 may be partially encapsulated by a mold compound 107 (e.g., an epoxy), or a similar material as the underlying substrate 106.

The conductive routing region 104 formed over the bare die 108 (and optional further bare die 128) may include multiple conductive routing layers 140 formed in a layered manner to define a conductive routing layer stack 142. In the illustrated example, the conductive routing layer stack 142 includes conductive routing layers 140a-140f. It should be understood that the conductive routing region 104 may include any other number of conductive routing layers 140.

In some examples, the conductive routing region 104 comprises a redistribution layer (RDL) region, wherein the multiple conductive routing layers 140 comprise respective multiple RDL layers. Further, in some examples the multiple conductive routing layers 140 (e.g., RDL layers) comprise a number of metal layers and via layers formed in an alternating manner. For example, the example conductive routing layers 140a-140f (e.g., RDL layers) shown in FIG. 1 may include metal layers 140b, 140d, and 140f and via layers 140a, 140c, and 140e formed in an alternating manner. In some examples, respective metal layers may be formed concurrently with respective via layers, e.g., using a dual damascene process in which a metal layer with underlying vias are formed concurrently by a metal deposition. In other examples, metal layers and via layers may be formed separately, e.g., wherein respective metal layers and via layers are formed using a single damascene process or a process involving metal layer deposition and selective metal etch.

The conductive routing structure 110 formed in the conductive routing region 104 includes respective conductive elements 144 formed in one or more respective conductive routing layers 140. Conductive elements 144 may include, for example, metal lines or other metal elements formed in one or more metal layers 140b, 140d, and 140f, and vias or other or other metal elements formed in one or more via layers 140a, 140c, and 140e. In some examples, metal layers 140b, 140d, and 140f may comprise thick metal layers (e.g., thick copper layers) having a respective thickness greater than 20 μm in the z-direction.

Conductive elements 144 formed in respective conductive routing layers 140 may be formed in, and at least partially covered by, a dielectric region 148 comprising one or more dielectric materials. In some examples, the dielectric region 148 may comprise at least one low-k polymer dielectric, e.g., at least one epoxy, polyimide, and/or other dielectric material(s) having a respective dielectric constant less than 4.0.

Conductive elements 144 in the top metal layer 140*f* may define respective external contact elements 146 contactable by respective external devices (external to the IC package 100), e.g., to provide electrical connection to bare die 108 (in particular, to IC circuitry 114 in bare die 108) and/or further bare die 128 (in particular, to IC circuitry 130 in further bare die 128). In some examples, the external contact elements 146 in the top metal layer 140*f* may be referred to as bond pads.

Respective conductive elements 144 in multiple conductive routing layers 140*a*-140*f* may connect to each other to define various conductive paths in the conductive routing region 104, e.g., to route electrical signals to, or from, bare die 108 and/or further bare die 128. For example, respective conductive elements 144 may define a conductive path between bare die 108 and further bare die 128 allowing communication between bare die 108 and further bare die 128. In addition or alternatively, respective conductive elements 144 may define a conductive path between bare die 108 and a respective external contact element 146, e.g., wherein the respective conductive elements 144 are connected between the IC contact 118 (which is connected to IC circuitry 114) and a respective external contact element 146, allowing communication between bare die 108 and a respective external device connected to the respective external contact element 146. In addition or alternatively, respective conductive elements 144 may define a conductive path between the further bare die 128 and a respective external contact element 146, e.g., wherein the respective conductive elements 144 are connected between the IC contact 134 (which is connected to IC circuitry 130) to a respective external contact element 146, allowing communication between the further bare die 128 and a respective external device connected to the respective external contact element 146. The example conductive routing structure 110 shown in FIG. 1 is merely intended to illustrate several example conductive paths, and is thus illustrated using dashed lines. It should be understood that conductive routing structure 110 may include respective conductive elements 144 in any respective conductive routing layers 140 to define conductive path(s) between any respective devices.

As mentioned above, in addition to the conductive routing structure 110, the in-package inductive device 102 may also be formed in the conductive routing region 104, and may include one or more conductive element(s) 144 formed in respective conductive routing layer(s) 140. In some examples, the in-package inductive device 102 may include at least one winding comprising conductive element(s) 144 formed in at least one conductive routing layer 140. The example in-package inductive device 102 shown in FIGS. 1A-1B comprises a single conductive winding 150 comprising a spiral-shaped conductive element 144 formed in the conductive routing layer 140*d*. In other examples, the winding 150 may include respective conductive elements 144 of multiple adjacent conductive routing layers 140, e.g., to increase the thickness (in the z-direction) of the winding 150.

As shown in FIGS. 1A and 1B, in some examples the in-package inductive device 102 may include a core 154 arranged within the winding 150, i.e., wherein the winding 150 extends (e.g., spirals) around the core 154 in the x-y plane, as shown in FIG. 1B. The core 154 may comprise a high-permeability core material 156, e.g., a magnetic paste or other high-permeability material. As used herein, a high-permeability material has a permeability greater than 1.0. In one example, the high permeability core material 156 includes magnetic nanoparticles. As discussed below, in some examples the core 154 may be formed by forming an opening 158 in the conductive routing region 104, and depositing the high-permeability core material 156 in the opening 158. In some examples, the opening 158 may be formed by a laser drilling process.

As shown in FIG. 1, the conductive routing structure 110 may include at least one conductive element 144 defining at least one conductive routing structure separate from the in-package inductive device 102 and formed in the same conductive routing layer 140*d* as the winding 150.

In some examples, the in-package inductive device 102 may be electrically coupled in series between the bare die 108 and the further bare die 128 (e.g., by respective conductive elements 144 formed in respective conductive routing layers 140) to provide a galvanic isolation between the bare die 108 and the further bare die 128. As another example, the in-package inductive device 102 may be electrically coupled in series between the bare die 108 and a respective external contact element 146 (e.g., by respective conductive elements 144 formed in respective conductive routing layers 140). As another example, e.g., as shown in FIG. 2 discussed below, the in-package inductive device 102 may be electrically coupled in series between two contacts of a respective bare die, for example bare die 108.

FIG. 2 is a cross-sectional side view of an example IC package 200 including an example in-package inductive device 202 formed in a conductive routing region 204, according to one example. The example IC package 200 may include a substrate 206, four bare dies 208*a*-208*d* mounted on the substrate 206, the conductive routing region 204 (e.g., an RDL region) formed over the bare dies 208*a*-208*d*, and a conductive routing structure 210, wherein the conductive routing structure 210 and the in-package inductive device 202 (inductor) are formed in the conductive routing region 204. In some examples, the IC package 200 may comprise a chip-first package (e.g., a PLP or a SiP), wherein the bare dies 208*a*-208*d* are mounted to the substrate 206 prior to forming the conductive routing region 204 over the bare dies 208*a*-208*d*. The substrate 206 may comprise a polymer, e.g., an epoxy, polyimide, PBO), or other suitable substrate for mounting bare dies. The bare dies 208*a*-208*d* may be partially encapsulated by a mold compound 207 (e.g., an epoxy), or a similar material as the underlying substrate 206.

The conductive routing region 204 includes a stack of conductive routing layers 240*a*-2401, e.g., including metal layers and via layers formed in an alternating manner. The conductive routing structure 210 formed in the conductive routing region 204 includes respective conductive elements 244 formed in respective conductive routing layers 240*a*-2401. Conductive elements 244 may be formed in, and at least partially covered by, a dielectric region 248 comprising one or more dielectric materials, e.g., at least one epoxy, polyimide, and/or other low-k dielectric material(s) having a respective dielectric constant less than 4.0. The conductive routing structure 210 may include external contact elements 246 exposed through the dielectric region 248 to allow connection to respective bare dies 208*a*-208*d* by external electronic devices (i.e., external to the IC package 200).

The example in-package inductive device 202 may be similar to the in-package inductive device 102 shown in FIGS. 1A and 1B and discussed above. For example, the example in-package inductive device 202 may be an inductor including a single winding 250 comprising a spiral-shaped conductive element 244 formed in the conductive routing layer 240*f*. Similar to the example in-package inductive device 102 discussed above, the in-package inductive device 202 may optionally include a core 254 arranged within the winding 250, i.e., wherein the winding 250 extends (e.g., spirals) around the core 254. The core 254 may comprise a high-permeability material, e.g., as discussed above regarding the high-permeability material 156 of the optional core 154 of in-package inductive device 102 shown in FIGS. 1A-1B.

In this example, the in-package inductive device 202 is electrically connected to the bare die 208*a*. In particular, an outer section of the winding 250, indicated as outer winding section 250O, is connected to a first IC contact 218*a* of the bare die 208*a* through respective conductive elements 244 and respective vias, and an inner section of the winding 250, indicated at as inner winding section 250*i*, is connected to a second IC contact 218*b* of the bare die 208*a* through respective conductive elements 244 and respective vias.

Figure 3A:
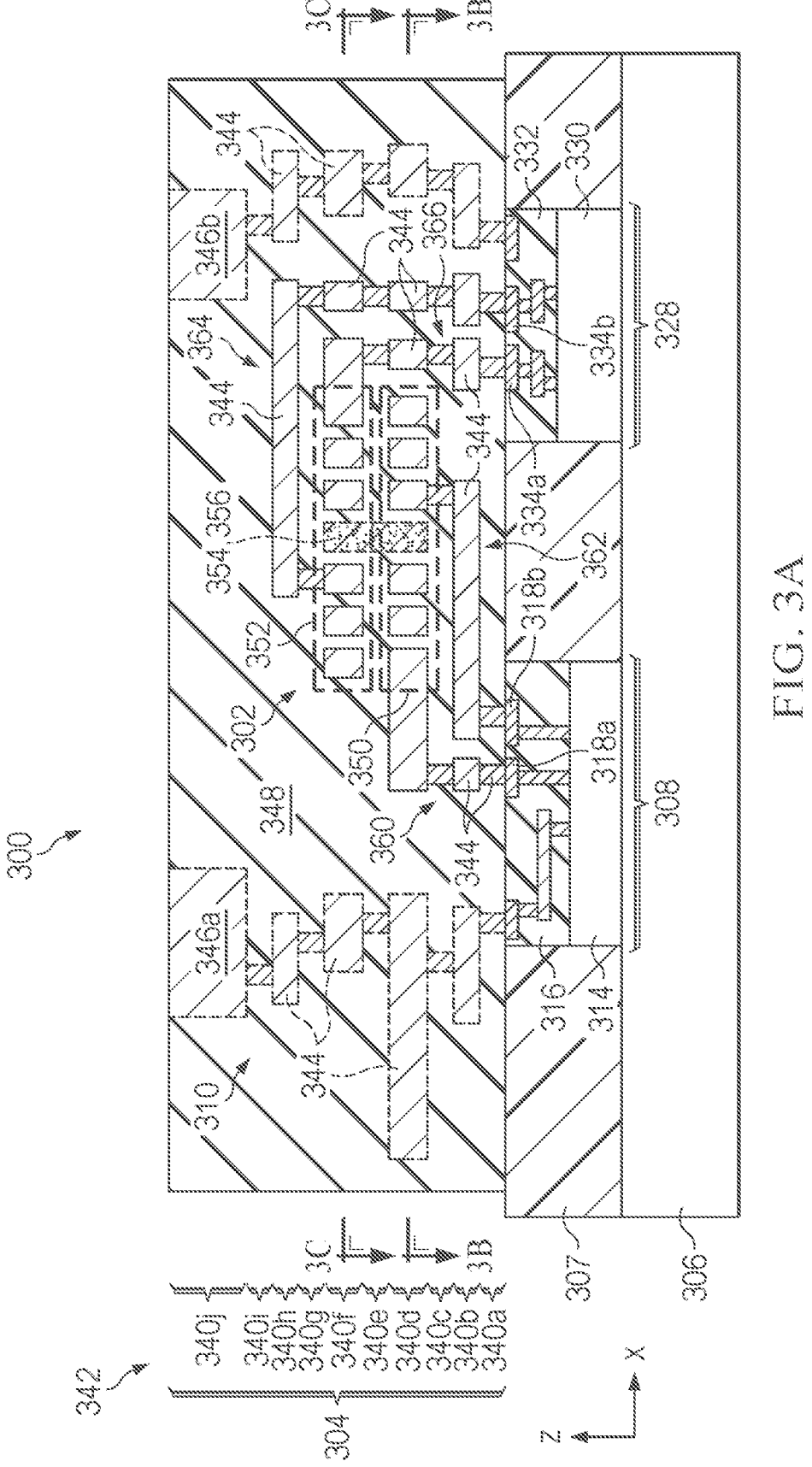
FIGS. 3A-3C show an example IC package including an example in-package transformer formed in a conductive routing region over multiple bare dies mounted in the IC package.
Figures 3B, 3C:
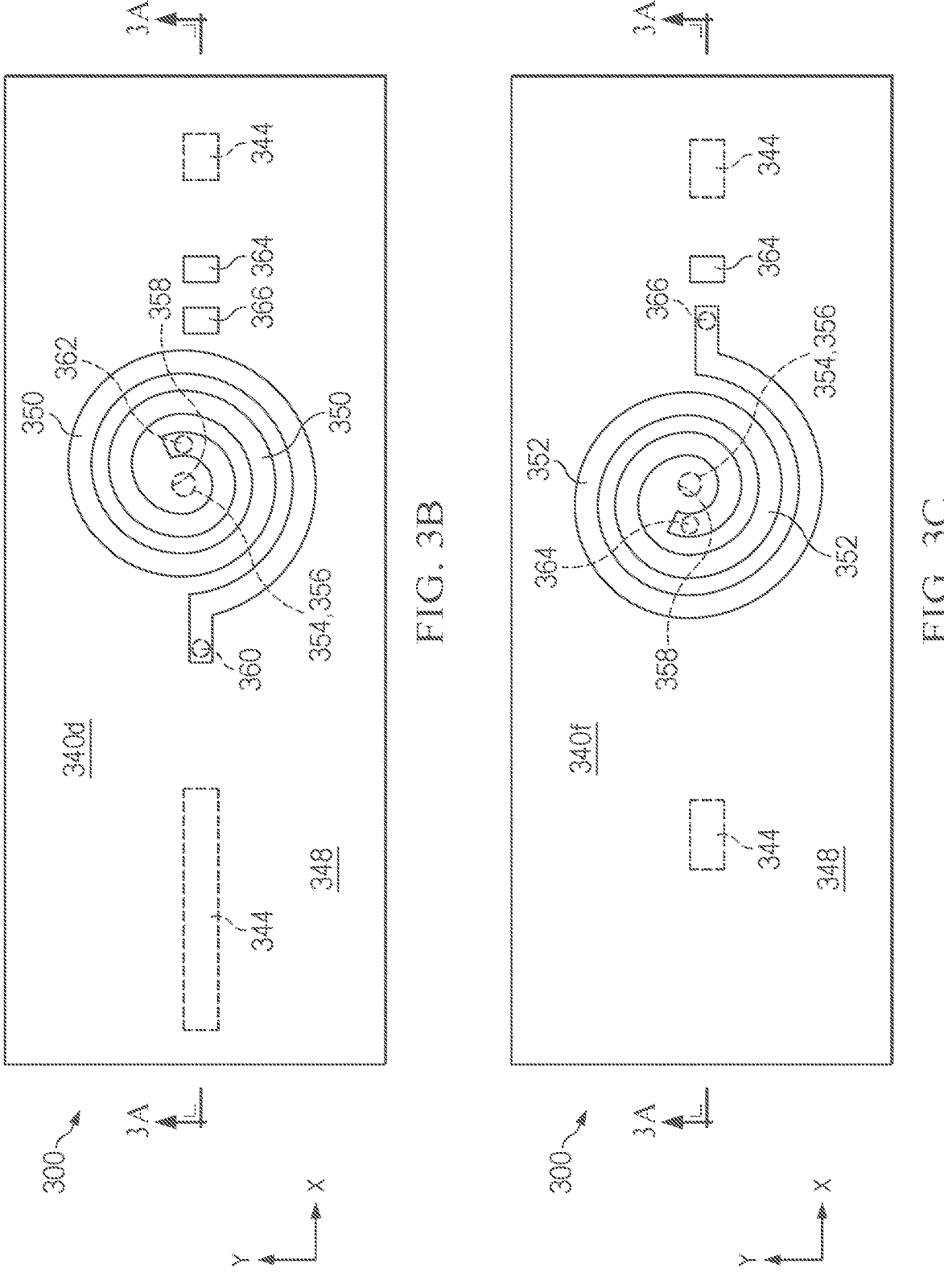

FIGS. 3A-3C show an example IC package 300 including an example in-package inductive device 302 formed in a conductive routing region 304, according to one example. FIG. 3A is a cross-sectional side view of IC package 300 through lines 3A-3A respectively shown in FIGS. 3B and 3C, FIG. 3B is a top-down cross-sectional view through line 3B-3B shown in FIG. 3A, and FIG. 3C is a top-down cross-sectional view through line 3C-3C shown in FIG. 3A. As discussed below, the example in-package inductive device 302 comprises a transformer including a pair of windings formed in the conductive routing region over multiple bare dies.

The example IC package 300 may include a substrate 306, at least a first bare die 308 and a second bare die 328 mounted on the substrate 306, a conductive routing region 304 (e.g., an RDL region) formed over the bare dies 308 and 328, and a conductive routing structure 310, wherein the conductive routing structure 310 and the in-package inductive device 302 (transformer) are formed in the conductive routing region 304. In some examples, the IC package 300 may comprise a PLP or a SiP formed by a chip-first method wherein the bare dies 308 and 328 are mounted to the substrate 306 prior to forming the conductive routing region 304 over the bare dies 308 and 328. The substrate 306 may comprise a polymer, e.g., an epoxy, polyimide, PBO), or other suitable substrate for mounting bare dies. The bare dies 308 and 328 may be partially encapsulated by a mold compound 307 (e.g., an epoxy), or a similar material as the underlying substrate 306. The first bare die 308 and second bare die 328 may also be referred to as "bare die 308" and "further bare die 328."

The first bare die 308 may include IC circuitry 314, a dielectric region 316 at least partially encapsulating the IC circuitry 314, and a first IC contact 318*a* and second IC contact 318*b* exposed through the dielectric region 316. Similarly, the second bare die 328 may include IC circuitry 330, a dielectric region 332 at least partially encapsulating the IC circuitry 330, and a first IC contact 334*a* and second IC contact 334*b* exposed through the dielectric region 332.

Respective IC circuitry 314 and 330 of bare dies 308 and 328 may include at least one transistor, resistor, capacitor, diode, inductor (i.e., "on-chip" or "chip-level" inductor), logic gate, operational amplifier, and/or other IC circuit element(s). Respective dielectric regions 316 and 332 of bare dies 308 and 328 may comprise a polyimide or other passivation region or material, or any other insulative material at least partially covering the respective IC circuitry 314 and 330, for example to provide electrical insulation, physical protection and/or structural support. Respective IC contacts 318*a*, 318*b*, 334*a*, and 334*b* of bare dies 308 and 328 may comprise a top metal element, bond pad, or other conductive element allowing electrical connection between the respective IC circuitry 314, 330 and external electronics (i.e., outside bare dies 308 and 328).

The conductive routing region 304 includes a stack of conductive routing layers 340*a*-340*j*, e.g., including metal layers and via layers formed in an alternating manner. The conductive routing structure 310 formed in the conductive routing region 304 includes respective conductive elements 344 formed in respective conductive routing layers 340*a*-340*j*, which may be formed in, and at least partially covered by, a dielectric region 348. The conductive routing structure 310 may include external contact elements, e.g., optional external contact elements 346*a* and 346*b* shown in FIG. 3A, exposed through the dielectric region 348 to allow connection to respective bare dies 308 and 328 by external electronic devices (i.e., external to the IC package 300).

In this example, the in-package inductive device 302 comprises a transformer between the first bare die 308 and second bare die 328, e.g., to provide galvanic isolation between the bare dies 308 and 328. Accordingly, the in-package inductive device 302 is also referred to herein as in-package transformer 302. The in-package transformer 302 includes (a) a first winding 350 formed in a first conductive routing layer 340*d* and connected to the first bare die 308 and (b) a second winding 352 formed in a second conductive routing layer 340*f* and connected to the second bare die 328, wherein the second winding 352 is magnetically coupled to the first winding 350.

The first winding 350 is connected to the first bare die 308 by respective conductive elements 344 formed in respective conductive routing layers 340 and respective vias. In particular, as shown in FIGS. 3A and 3B, an outer location of the first winding 350 is connected to the first IC contact 318*a* of the first bare die 308 by a first connection 360 (defined by respective conductive elements 344 and respective vias), and an inner location of the first winding 350 is connected to the second IC contact 318*b* of the first bare die 308 by a second connection 362 (defined by respective conductive elements 344 and respective vias).

The second winding 352 is connected to the second bare die 328 by respective conductive elements 344 formed in respective conductive routing layers 340. In particular, as shown in FIGS. 3A and 3C, an outer location of the second winding 352 is connected to the first IC contact 334*a* of the second bare die 328 by a first connection 366 (defined by respective conductive elements 344 and respective vias), and an inner location of the second winding 352 is connected to the second IC contact 334*b* of the second bare die 328 by a second connection 364 (defined by respective conductive elements 344 and respective vias).

The first winding 350 and second winding 352 are spaced apart from each other in the z-direction, in particular by dielectric material of the dielectric region 348. Thus, the separation distance (in the z-direction) between the first and second windings 350 and 352 may be controlled by selecting the thickness of the conductive routing layer 340*e*.

The in-package transformer 302 may optionally include a core 354 arranged within the first and second windings 350 and 352, i.e., wherein the first and second windings 350 and 352 extend around (e.g., spiral around) the core 354. The core 354 may comprise a high-permeability material 356, e.g., a magnetic paste or other high-permeability material. In one example, the high permeability core material 356 includes magnetic nanoparticles. The core 354 may be formed by forming an opening 358 in the conductive routing region 304, and depositing the high-permeability core material 356 in the opening 358. In some examples, the opening 358 may be formed by a laser drilling process.

FIG. 3A also illustrates an example (optional) conductive connection between the first bare die 308 and optional external contact element 346a defined by respective conductive elements 344 and respective vias formed in respective conductive routing layers 340, and an example (optional) conductive connection between the second bare die 328 and optional external contact element 346b defined by respective defined by respective conductive elements 344 and respective vias formed in respective conductive routing layers 340. It should be understood FIGS. 3A-3C show one example configuration only. In other examples the in-package transformer 302 may be connected to one of the first bare die 308 or the second bare die 328, rather than being connected between the first bare die 308 and second bare die 328. For example, the in-package transformer 302 may be connected between the first bare die 308 and optional external contact elements (e.g., external contact elements 346a and 346b), such that the in-package transformer 302 is connected between the first bare die 308 and an external device (external to the IC package 300) connected to the external contact elements, e.g., to provide galvanic isolation between the first bare die 308 and an external device e.g., as shown in the example of FIG. 4, discussed below.

As another example, the in-package transformer 302 may be connected between discrete electronics within a respective bare die, e.g., the first bare die 308 or second bare die 328. For example, the first winding 350 may be connected to first IC contacts of the first bare die 308, and the second winding 352 may be connected to second IC contacts of the first bare die 308, e.g., to provide galvanic isolation between the first bare die 308 and the second bare die 328.

Figure 4:
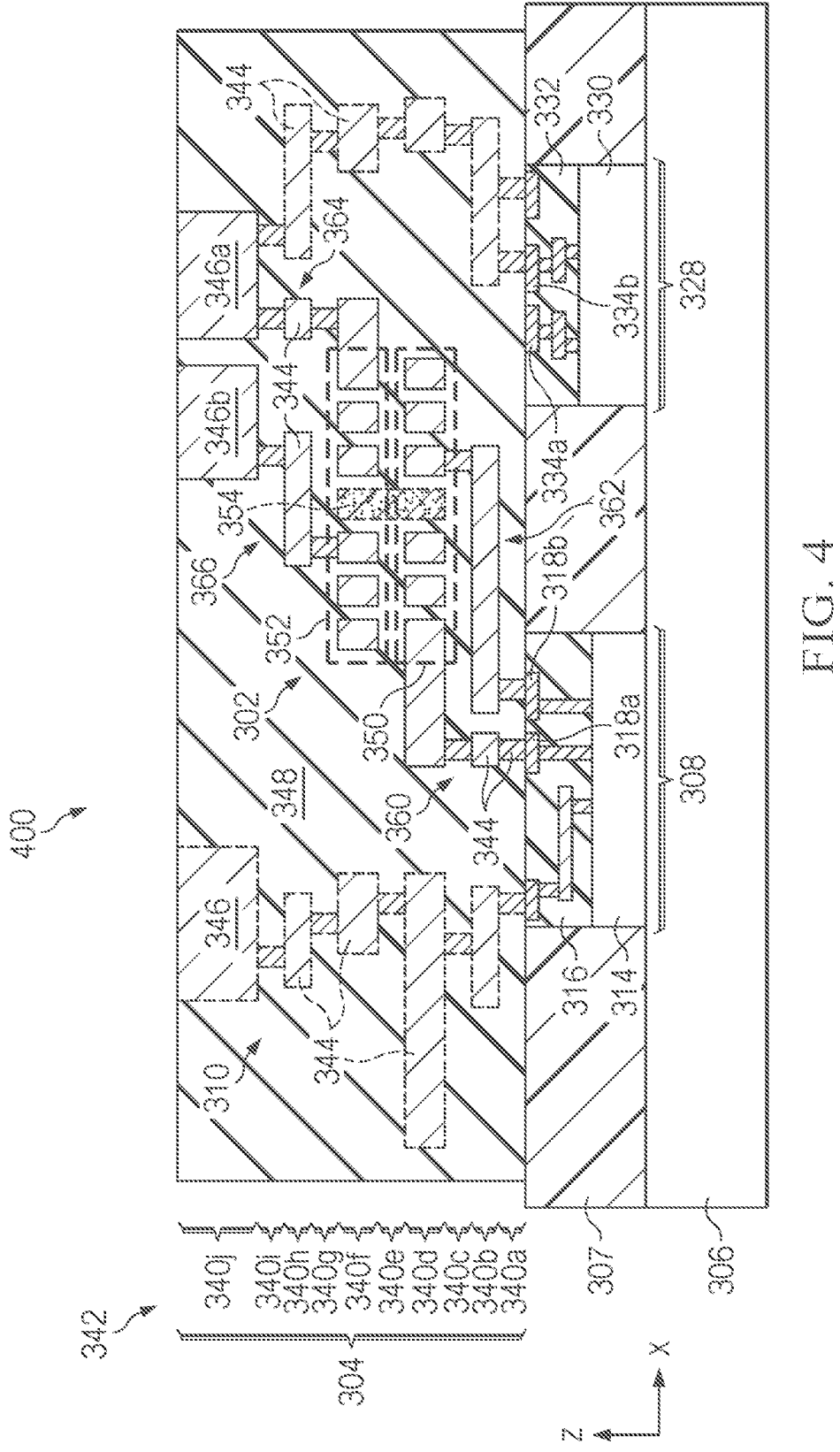
FIG. 4 is a cross-sectional side view of an example IC package including an in-package transformer connected between two bare dies mounted in the IC package.

FIG. 4 is a cross-sectional side view of an example IC package 400 (e.g., a PLP, SiP, or other chip-first package) including the example in-package transformer 302 discussed above, wherein the in-package transformer 302 is connected between the first bare die 308 and external contact elements 346a and 346b, such that the in-package transformer 302 is connected between the first bare die 308 and an external device (external to the IC package 400) connected to the external contact elements, e.g., to provide galvanic isolation between the first bare die 308 and the external device.

In this example, the first winding 350 of the in-package transformer 302 is connected to the first bare die 308, and the second winding 352 of the in-package transformer 302 (which second winding 352 is magnetically coupled to the first winding 350) is connected to the external contact elements 346a and 346b. In particular, as shown in FIG. 4, an outer location of the first winding 350 is connected to the first IC contact 318a of the first bare die 308 by a first connection 360 (defined by respective conductive elements 344 and respective vias), and an inner location of the first winding 350 is connected to the second IC contact 318b of the first bare die 308 by a second connection 362 (defined by respective conductive elements 344 and respective vias). Further, an outer location of the second winding 352 is connected to the external contact element 346a by a first connection 364 (defined by respective conductive elements 344 and respective vias), and an inner location of the second winding 352 is connected to the external contact element 346b by a second connection 366 (defined by respective conductive elements 344 and respective vias).

Figures 5A, 5B:
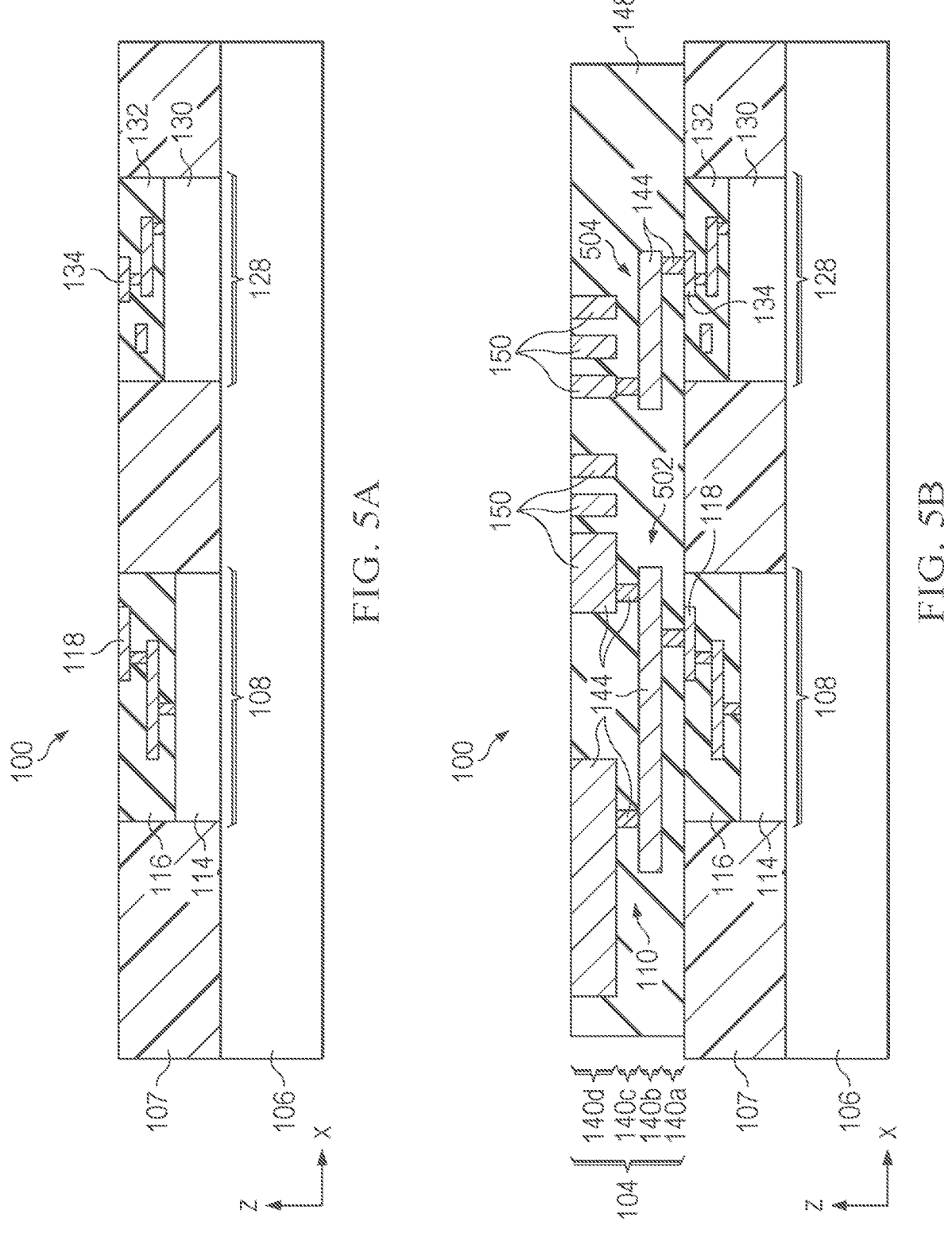
FIGS. 5A-5E are a series of cross-sectional side views showing an example method of forming the example IC package including shown in FIGS. 1A and 1B.

FIGS. 5A-5E are a series of cross-sectional side views showing an example chip-first method for forming the example IC package 100 shown in FIGS. 1A-1B, e.g., including the conductive routing structure 110 and in-package inductive device 102 formed in the conductive routing region 104 over example bare dies 108 and 128. In this example, the in-package inductive device 102 may comprise an inductor including winding 150 (and optional core 154) formed in the conductive routing region 104. As shown in FIG. 5A, the bare dies 108 and 128 may be mounted on the substrate 106, and mold compound 107 may be deposited over the bare dies 108 and 128 and planarized to expose the upper surfaces of the bare dies 108 and 128, particularly IC contacts 118, 134.

As shown in FIG. 5B, conductive routing layers 140a-140d including respective conductive elements 144 may be formed, e.g., using any suitable process for forming RDL or other interconnect layers. For example, respective conductive routing layers 140 may be formed by distinct processes (e.g., wherein conductive routing layers 140a, 140b, 140c, and 140b are respectively formed using a single damascene process or a process involving metal layer deposition and selective metal etch), or multiple conductive routing layers 140 may be formed together, e.g., using a dual damascene process in which conductive elements 144 (e.g., metal lines) of a respective conductive routing layer 140 (e.g., conductive routing layer 140b) are formed concurrently with underlying conductive elements 144 (e.g., vias) of an underlying conductive routing layer 140 (e.g., conductive routing layer 140a).

As discussed above regarding FIGS. 1A-1B, the conductive routing structure 110 and in-package inductive device 102 may be formed in (e.g., at least partially encapsulated by) a dielectric region 148 comprising one or more dielectric material, e.g., one or more low-k polymer dielectric, e.g., one or more epoxy, polyimide, and/or other low-k dielectric having a dielectric constant less than 4.0. Accordingly, forming conductive routing layers 140a-140f of the conductive routing region 104 may include forming respective conductive elements 144 in respective dielectric material(s), e.g., using any suitable process for forming RDL or interconnect structures including conductive elements formed in (e.g., at least partially encapsulated by) dielectric material. In some examples, the dielectric region 148 includes a common (same) dielectric material deposited or otherwise formed in the conductive routing layers 140a-140f. In other examples, the dielectric region 148 includes different dielectric materials deposited or otherwise formed in different conductive routing layers 140a-140f.

In this example, a respective conductive element 144 formed in conductive routing layer 140b defines the winding 150 of the in-package inductive device 102 (e.g., inductor) being formed. The winding 150 is (a) conductively connected to the first bare die 108 by a routing structure 502 (including respective conductive element 144 of respective conductive routing layers 140a-140c and respective vias) connected to the IC contact 118 of the first bare die 108, and (b) conductively connected to the second bare die 128 by a routing structure 504 (including respective conductive element 144 of respective conductive routing layers 140a-140c and respective vias) connected to the IC contact 134 of the second bare die 128. Accordingly, the in-package inductive device 102 is electrically coupled between the first bare die 108 and second bare die 128.

Figure 5C:
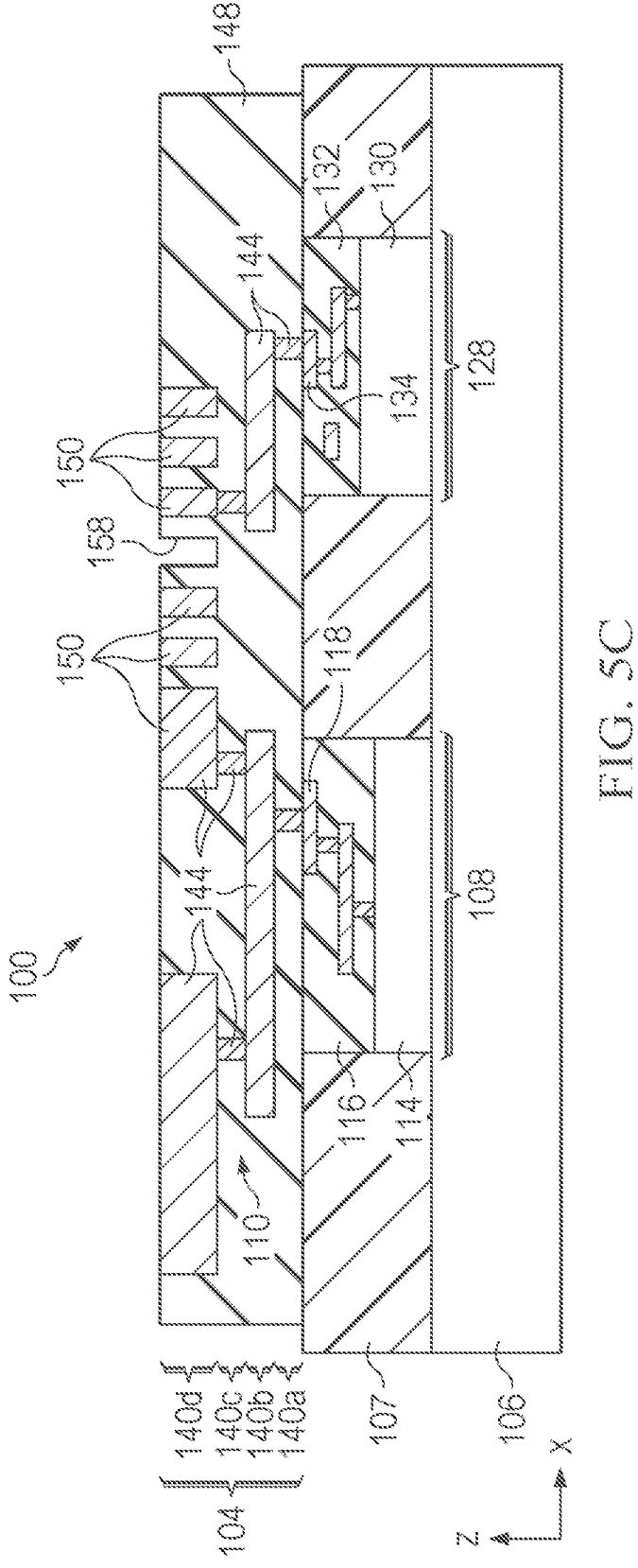
Figure 5D:
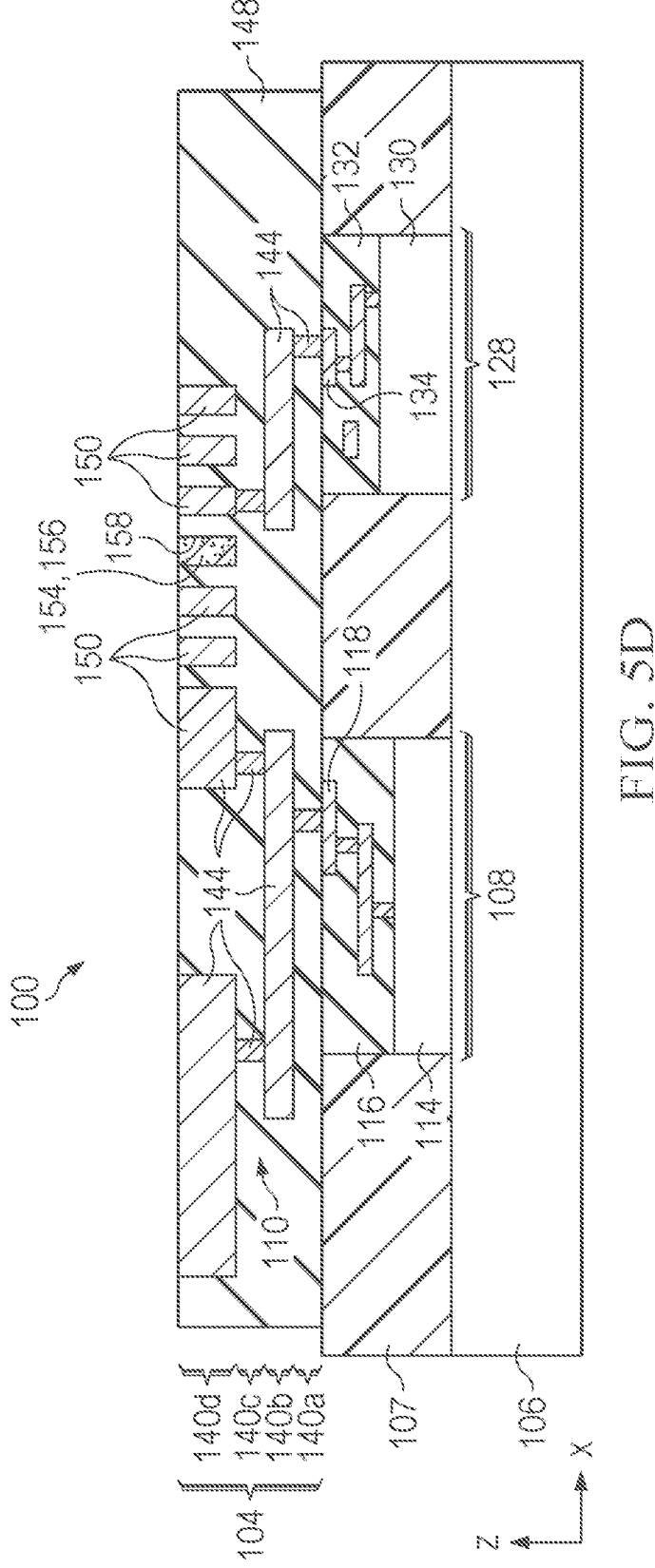

In some examples, the optional core 154 may be formed after forming the winding 150. An example process for forming the core 154 is shown in FIGS. 5C and 5D. As shown in FIG. 5C, an opening 158 may be formed in the dielectric region 148 in a central area of the winding 150, e.g., using a laser drilling process. As shown in FIG. 5D, the high-permeability core material 156 is deposited in the opening 158, e.g., by a "squeegee" deposition process, by an additive process (e.g., 3D printing), or by other deposition process, to define the core 154. The high-permeability core material 156 may comprise a magnetic paste or other high-permeability material. In one example, the high per-meability core material 156 includes magnetic nanopar-ticles. In other examples, the core 154 may be omitted, such that the process shown in FIGS. 5C and 5D may be omitted.

In some examples, after forming the winding 150 and optionally the core 154, the winding 150 and/or core 154 may be laser trimmed, e.g., to achieve enhanced precision of respective dimensions of the winding 150 and/or core 154.

Figure 5E:
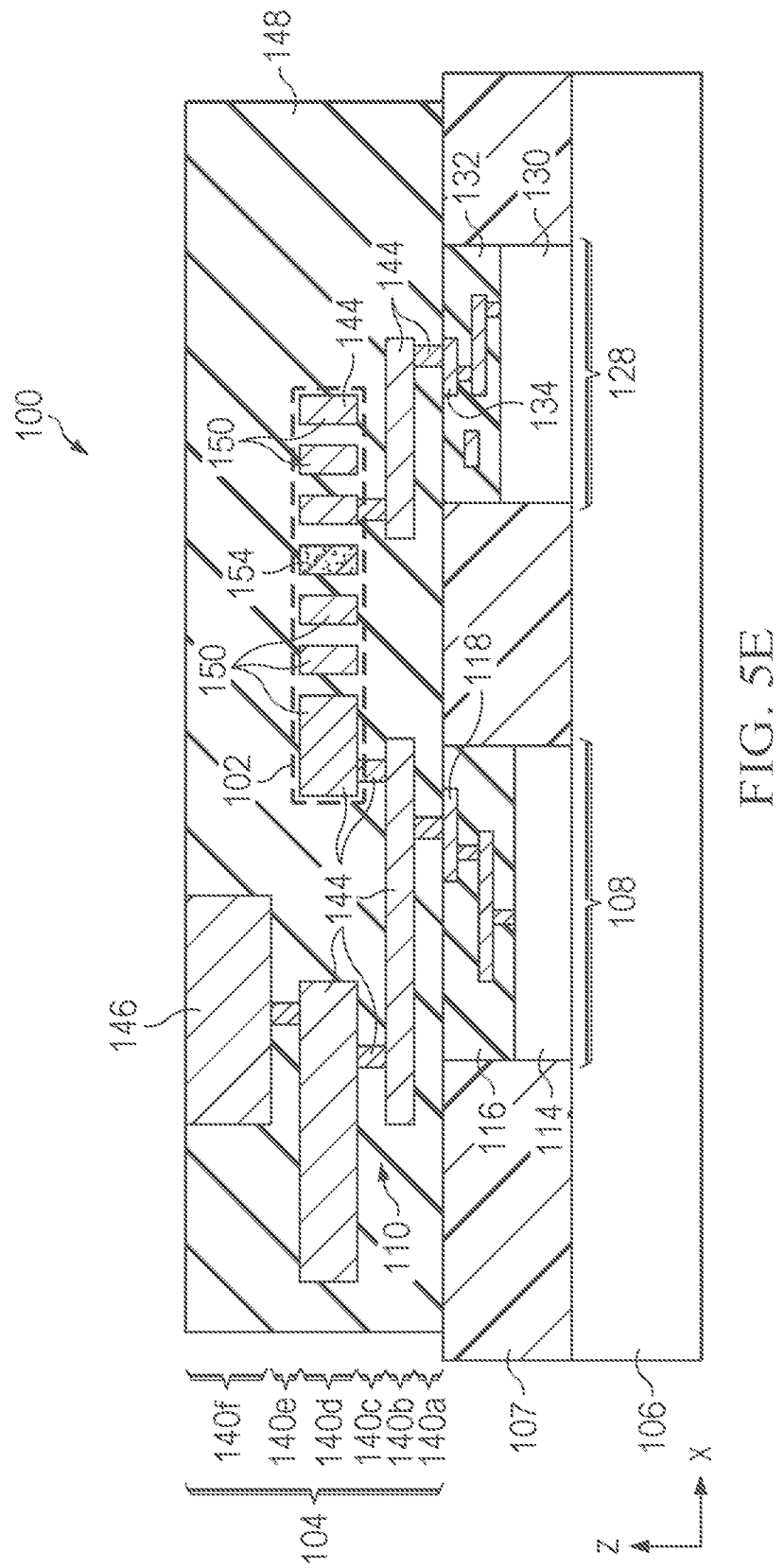

As shown in FIG. 5E, additional conductive routing layers 140 may be formed, in this example conductive routing layers 140e-140f, including additional conductive elements 144 of the conductive routing structure 110, in this example to connect the first bare die 108 to a respective external contact element 146.

Figure 6C:
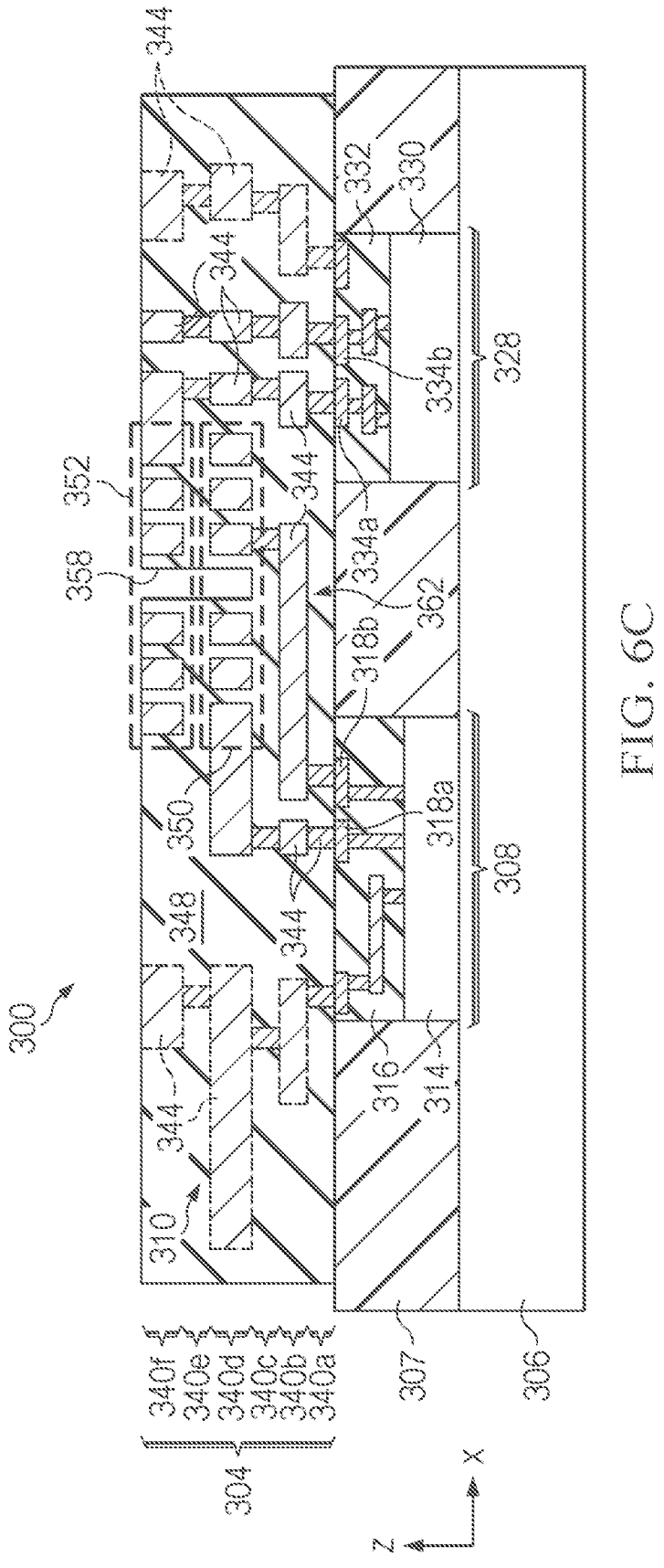

FIGS. 6A-6E are a series of cross-sectional side views showing an example chip-first method for forming the example IC package 300 shown in FIGS. 3A-3C, e.g., including the conductive routing structure 310 and the in-package transformer 302 including the first winding 350 and second winding 352 formed in the conductive routing region 304 over the first bare die 308 and second bare die 328. As shown in FIG. 6A, the bare dies 308 and 328 may be mounted on the substrate 306, and mold compound 307 may be deposited over the bare dies 308 and 328 and planarized to expose the upper surfaces of the bare dies 308 and 328, particularly the IC contacts 318a, 318b of first bare die 308 and IC contacts 334a and 334b of second bare die 328.

As shown in FIG. 6B, conductive routing layers 340a-340f including respective conductive elements 344 may be formed, e.g., using any suitable process for forming RDL or other interconnect layers. For example, respective conduc-tive routing layers 340 may be formed by distinct processes (e.g., using a single damascene process or a process involv-ing metal layer deposition and selective metal etch), or multiple conductive routing layers 340 may be formed concurrently, e.g., using a dual damascene process.

As discussed above, the conductive routing structure 310 and in-package transformer 302 may be formed in (e.g., at least partially encapsulated by) a dielectric region 348 comprising one or more dielectric material, e.g., one or more low-k polymer dielectric, e.g., one or more epoxy, polyim-ide, and/or other low-k dielectric having a dielectric constant less than 4.0. Accordingly, forming conductive routing lay-ers 340a-340f of the conductive routing region 304 may include forming respective conductive elements 344 in respective dielectric material(s), e.g., using any suitable process for forming RDL or interconnect structures includ-ing conductive elements formed in (e.g., at least partially encapsulated by) dielectric material.

In this example, a respective conductive element 344 formed in conductive routing layer 340d defines the first winding 350, and a respective conductive element 344 formed in conductive routing layer 340f defines the second winding 352. The first winding 350 is connected to the first IC contact 318a and second IC contact 318b of the first bare die 308 by respective conductive elements 344 and respec-tive vias, and the second winding 352 is connected to the first IC contact 334a and second IC contact 334b of the second bare die 328a by respective conductive elements 344 and respective vias, as discussed above with reference to FIGS. 3A-3C. Accordingly, the in-package transformer 302 is electrically coupled between the first bare die 308 and second bare die 328, to provide a galvanic isolation between the bare dies 308 and 328.

Figure 6D:
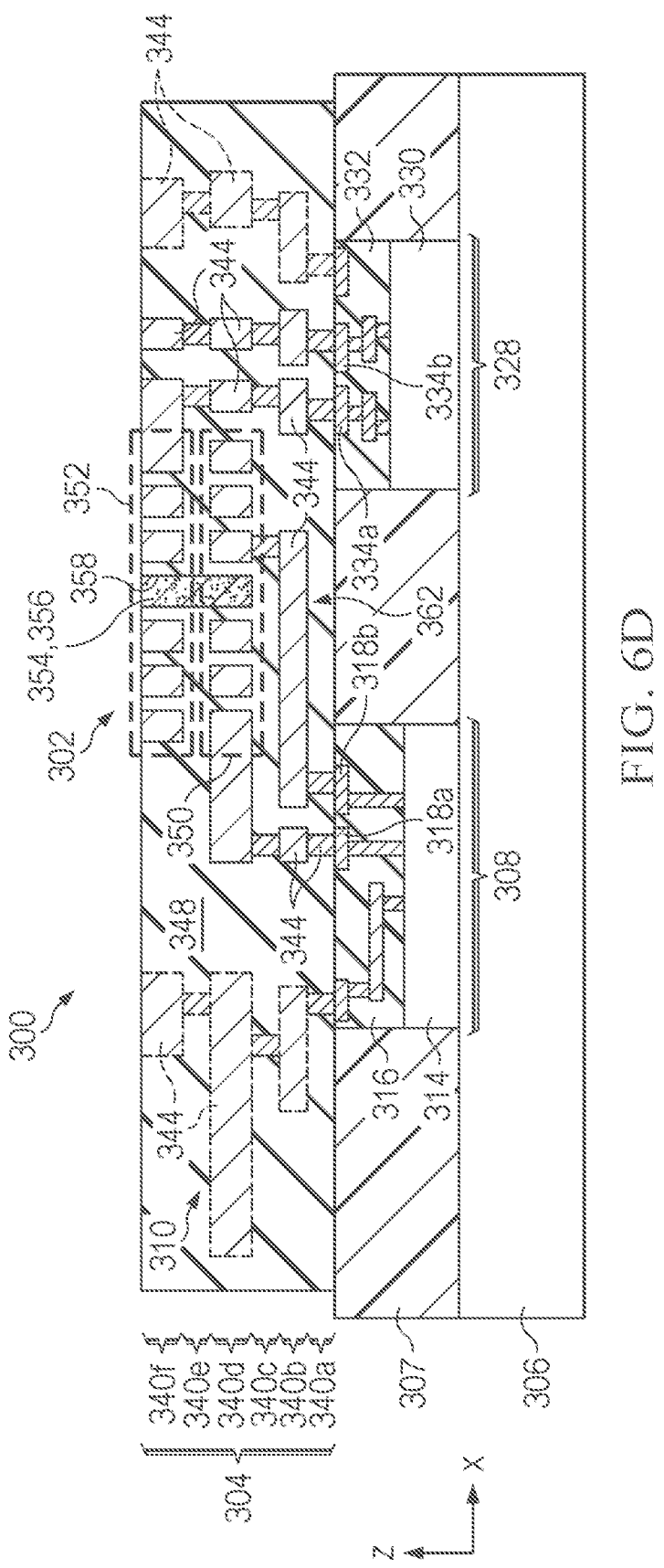

In some examples, the optional core 354 may be formed after forming the windings 350 and 352. An example process for forming the core 354 is shown in FIGS. 6C and 6D. As shown in FIG. 6C, the opening 358 may be formed in the dielectric region 348 in a central area of the windings 350 and 352, e.g., using a laser drilling process. As shown in FIG. 6D, the high-permeability core material 356 is depos-ited in the opening 358, e.g., by a "squeegee" deposition process, by an additive process (e.g., 3D printing), or by other deposition process, to define the core 354. The high-permeability core material 356 may comprise a magnetic paste or other high-permeability material. In one example, the high permeability core material 356 includes magnetic nanoparticles. In other examples, the core 354 may be omitted, such that the process shown in FIGS. 6C and 6D may be omitted.

In some examples, after forming respective components of the in-package transformer 302, e.g., including the first winding 350, second winding 352, and optional core 354, one or more of such respective components may be laser trimmed, e.g., to achieve enhanced precision of respective dimensions of the first winding 350, second conductive 352, and/or core 354.

Figure 6E:
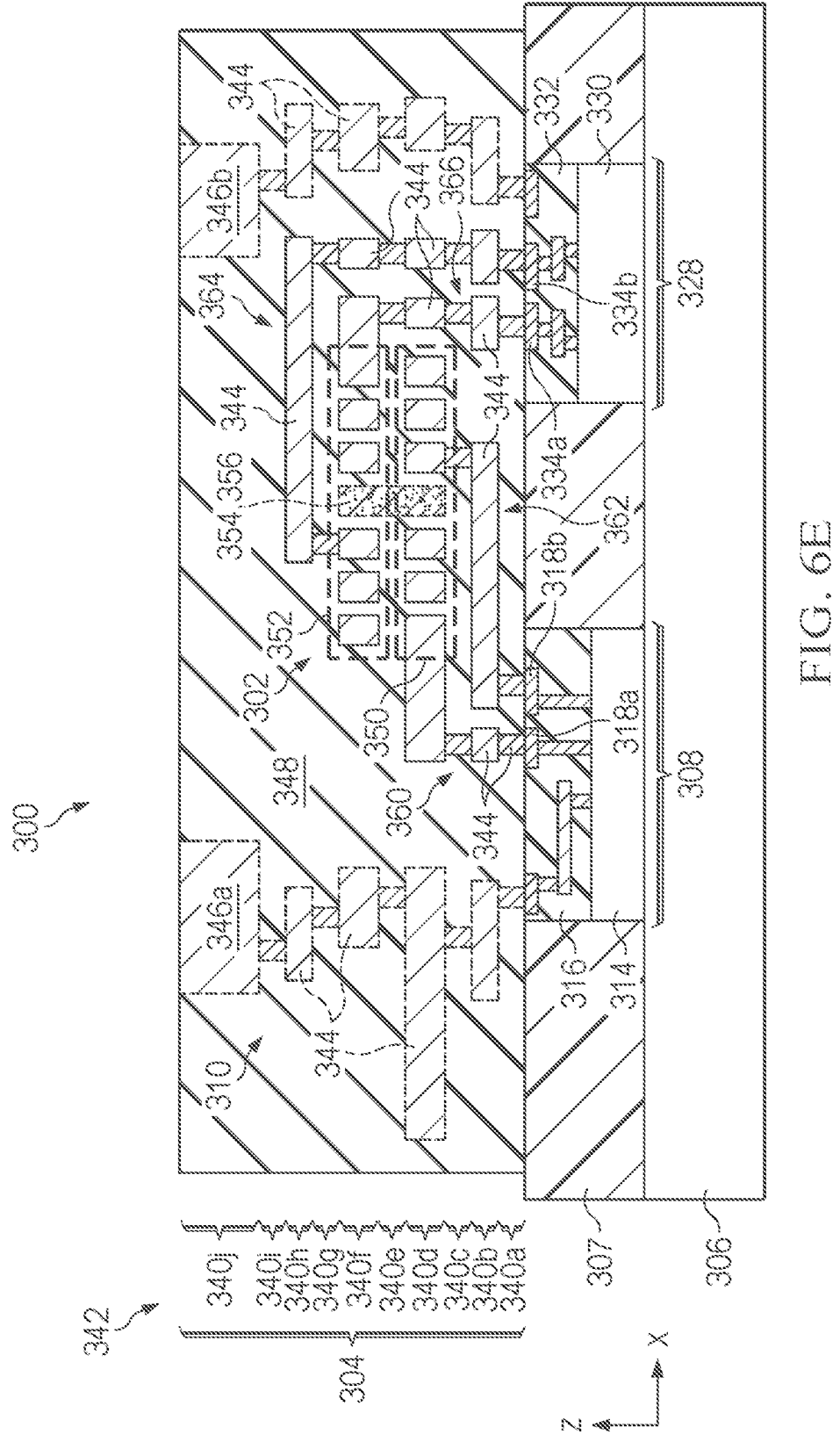

As shown in FIG. 6E, additional conductive routing layers 340 may be formed, in this example conductive routing layers 340g-340j, including additional conductive elements 344 of the conductive routing structure 310, for example to optionally connect the first bare die 308 to a respective external contact element 346a and/or to optionally connect the second bare die 328 to a respective external contact element 346b.

Figure 7:
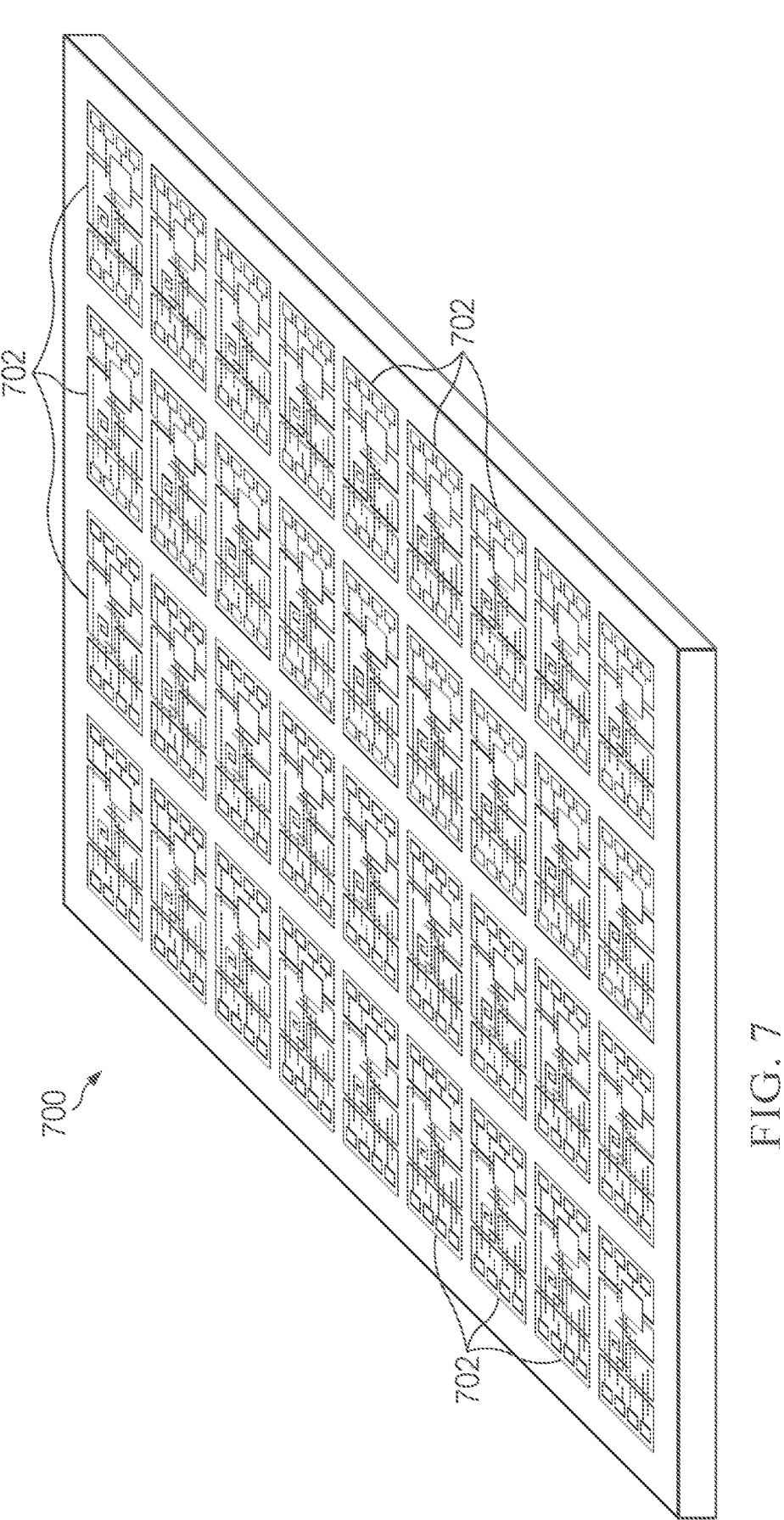
FIG. 7 shows an example panel including an array of PLPs formed thereon, wherein respective PLPs include at least one in-package inductive device according to the present disclosure.

As discussed above, in some examples an IC package including at least one in-package inductive device (e.g., at least one in-package inductor, transformer, and/or antenna) may be formed as a panel-level package (PLP). FIG. 7 is a three-dimensional view from above of a panel 700 including an array of panel-level packages (PLPs) 702 formed thereon, wherein respective PLPs 702 include at least one in-package inductive device according to the present disclosure. For example, respective PLPs 702 may correspond with or be similar to any of the example IC packages 100, 200, 300, or 400 shown in the drawings and described above. After forming the array of PLPs on the panel 700, individual PLPs 702 may be separated (singulated) by cutting the panel 700 at respective locations. In one example, the panel 700 may comprise a 24 inch by 24 inch panel substrate formed from a plastic material.

The invention claimed is:
1. An integrated circuit (IC) package, comprising:
a substrate;
a first bare die mounted on the substrate, the first bare die including first IC elements, a first dielectric region at least partially encapsulating the first IC elements, and a first IC contact exposed through the first dielectric region;
a second bare die mounted on the substrate;
a conductive routing region including multiple conductive routing layers, including at least a first conductive routing layer and a second conductive routing layer, formed over the first and second bare dies;
a conductive routing structure formed in the multiple conductive routing layers, wherein the conductive rout- ing structure is conductively connected to the first IC contact of the first bare die; and a transformer formed in the conductive routing region, the transformer including:

a first winding formed in the first conductive routing layer and conductively coupled to the first bare die; and a second winding formed in the second conductive routing layer, conductively coupled to the second bare die, and magnetically coupled to the first winding.

2. The IC package of claim 1, wherein the IC package comprises a chip-first package.

3. The IC package of claim 1, wherein the conductive routing region comprises a redistribution layer (RDL) region, wherein respective conductive routing layers of the multiple conductive routing layers comprise respective RDL layers.

4. The IC package of claim 1, wherein the conductive routing structure includes at least one conductive element separate from the transformer and formed in at least one of the first conductive routing layer or the second conductive routing layer.

5. The IC package of claim 1, wherein each of the first winding and the second winding has a spiral shape.

6. The IC package of claim 1, comprising:

a core comprising a magnetic paste or other material having a permeability greater than 1.0;

wherein at least one of the first winding and the second winding extends around the core.

7. A method of forming an integrated circuit (IC) package, comprising:

mounting a first bare die on a substrate, the bare die including IC elements, a dielectric region at least partially encapsulating the IC elements, and an IC contact exposed through the dielectric region; and mounting a second bare die on the substrate;

forming a conductive routing region over the over the first and second bare dies, wherein the conductive routing region includes (a) a conductive routing structure conductively connected to the IC contact of the bare die, and (b) a transformer connected between the first and second bare dies;

wherein the conductive routing region includes multiple conductive routing layers, including at least a first conductive routing layer and a second conductive routing layer;

wherein the conductive routing structure includes conductive elements formed in respective conductive routing layers of the multiple conductive routing layers; and wherein the transformer includes:

a first winding formed in the first conductive routing layer and conductively coupled to the first bare die; and a second winding formed in the second conductive routing layer, conductively coupled to the second bare die, and magnetically coupled to the first winding.

8. The method of claim 7, wherein forming the conductive routing region comprises forming a redistribution layer (RDL) region including multiple RDL layers.

9. The method of claim 7, comprising forming a respective conductive element of the conductive routing structure, separate from the first winding and second winding, in at least one of the first conductive routing layer or the second conductive routing layer.

10. The method of claim 7, comprising forming a transformer core by:

forming an opening in the conductive routing region; and depositing a core material in the opening;

wherein each of the first winding and the second winding extends around the transformer core.

11. The method of claim 10, comprising forming the opening by a laser drilling process.

12. An integrated circuit (IC) package, comprising:

a substrate;

a first bare die and a second bare die mounted on the substrate;

a conductive routing region including a conductive routing layer stack formed over the first bare die and the second bare die, the conductive routing layer stack including at least a first conductive routing layer and a second conductive routing layer;

a conductive routing structure comprising at least one first conductive element formed in the conductive routing layer stack; and a transformer connected between the first bare die and the second bare die, the transformer including:

a first winding formed in the first conductive routing layer and conductively coupled to the first bare die; and a second winding formed in the second conductive routing layer, conductively coupled to the second bare die, and magnetically coupled to the first winding.

13. The IC package of claim 12, wherein each of the first conductive routing layer and the first conductive routing layer comprises a respective redistribution layer (RDL).

\* \* \* \* \*